United States Patent [19]
Hsue et al.

[11] Patent Number: 5,585,656
[45] Date of Patent: Dec. 17, 1996

[54] HIGH COUPLING RATIO OF FLASH MEMORY

[75] Inventors: Chen-Chiu Hsue; Gary Hong, both of Hsin-Chu, Taiwan

[73] Assignee: United Microelectronics Corporation, Hsin-Chu, Taiwan

[21] Appl. No.: 435,190

[22] Filed: May 5, 1995

Related U.S. Application Data

[62] Division of Ser. No. 276,604, Jul. 18, 1994, Pat. No. 5,427,970.

[51] Int. Cl.$^6$ .................... H01L 27/115; H01L 29/788
[52] U.S. Cl. ............................. 257/321; 257/315
[58] Field of Search ..................... 257/321, 315

[56] References Cited

U.S. PATENT DOCUMENTS

| | | | |
|---|---|---|---|
| 5,278,089 | 1/1994 | Nakagawara | 437/52 |
| 5,293,331 | 3/1994 | Hart et al. | 257/321 |
| 5,434,813 | 7/1995 | Tamura et al. | 257/321 |

OTHER PUBLICATIONS

"A Novel Sublithographic Tunnel Diode Based 5V–Only Flash Memory" by M. Gill et al, IEDM 190 c. 1990 by IEEE, pp. 119–122.

"A High Capacitive–Coupling Ratio (HiCR) Cell for 3V–Only 64 Mbit and Future Flash–Memories" by Y. S. Hisamune et al, IEDM '93 c.1993 by IEEE, pp. 19–22.

*Primary Examiner*—Jerome Jackson, Jr.
*Attorney, Agent, or Firm*—William H. Wright

[57] ABSTRACT

A new method of fabricating a high coupling ratio Flash EEPROM memory cell is achieved. A layer of silicon dioxide is provided over the surface of a semiconductor substrate. A layer of silicon nitride is deposited over the silicon dioxide layer and patterned. The silicon dioxide layer not covered by the patterned silicon nitride layer is removed, thereby exposing portions of the substrate. A tunnel oxide layer is grown on the exposed portions of the semiconductor substrate. Silicon nitride spacers are formed on the sidewalls of the patterned silicon nitride layer. Ions are implanted into the substrate using the silicon nitride layer and spacers as a mask to form implanted regions within the semiconductor substrate. The semiconductor substrate is oxidized where the implanted regions have been formed leaving the thin tunnel oxide only under the silicon nitride spacers. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer. The second polysilicon layer is patterned to form a control gate. Passivation and metallization complete the fabrication of the memory cell with improved coupling ratio.

8 Claims, 3 Drawing Sheets

HIGH COUPLING RATIO OF FLASH MEMORY

This is a divisional of application Ser. No. 08/276,604 dated Jul. 18, 1994, now U.S. Pat. No. 5,427,970.

BACKGROUND OF THE INVENTION

1. Field of the Invention

The invention relates to a method of fabricating semiconductor memory devices employing floating gates, and more particularly, to a method of fabricating memory devices employing floating gates having improved coupling ratio.

2. Description of the Prior Art

One class of semiconductor memory devices employ floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. "Flash" memory devices are those in which all of the cells can be erased in a single operation.

A typical high coupling ratio Flash EEPROM of the prior art, such as that described in the paper, "A High Capacitive-Coupling Ratio (HiCR) Cell for 3 V-Only 64 Mbit and Future Flash Memories," by Y. S. Hisamune et al, IEDM 93, c. 1993 by IEEE, pp. 19–22, is illustrated in FIG. 1. Gate oxide layer 42 has been grown on the surface of a semiconductor substrate 10. The tunneling oxide 46, necessary for the erase function of the cell, is grown on either side of the gate oxide layer 42 surrounding the first polysilicon layer 48. The polysilicon layer 48 is sidewall oxidized with additional tunneling oxide 50. A second polysilicon deposition is used to form spacers 52. A third polysilicon layer 54 connects the first polysilicon layer 48 and the polysilicon spacers 52 to form the floating gate of the memory cell. Interpoly dielectric layer 56 and the control gate 58 consisting of a fourth polysilicon layer complete the memory cell structure. Source and drain regions 60 are shown on either side of the gate structure. This memory cell is fabricated by a complicated process using four layers of polysilicon, an oxide/nitride capping layer, a sidewall oxidation, and two sidewall spacer etchbacks. The step height is triple polysilicon.

The paper, "A Novel Sublithographic Tunnel Diode Based 5V-Only Flash Memory," by M. Gill et al, IEDM 90, C. 1990 by IEEE, pp. 119–122, describes a memory cell having a remote tunnel diode. U.S. Pat. No. 5,278,089 to Nakagawara describes a NOR type read-only memory (ROM).

SUMMARY OF THE INVENTION

A principal object of the present invention is to provide an effective and very manufacturable method of fabricating a flash EEPROM memory cell.

Another object of the present invention is to provide an effective and very manufacturable method of fabricating a high coupling ratio flash EEPROM memory cell.

In accordance with the objects of this invention a new method of fabricating a high coupling ratio Flash EEPROM memory cell is achieved. Field oxide regions are provided in and on a semiconductor substrate. A layer of silicon dioxide is provided over the surface of the semiconductor substrate. A layer of silicon nitride is deposited over the silicon dioxide layer and patterned. The silicon dioxide layer not covered by the patterned silicon nitride layer is removed, thereby exposing portions of the semiconductor substrate. A tunnel oxide layer is grown on the exposed portions of the semiconductor substrate. Silicon nitride spacers are formed on the sidewalls of the patterned silicon nitride layer. Ions are implanted into the substrate using the silicon nitride spacers and the patterned silicon nitride layer as a mask to form implanted regions within the semiconductor substrate. The semiconductor substrate is oxidized where the implanted regions have been formed leaving the thin tunnel oxide only under the silicon nitride spacers. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer. The second polysilicon layer is patterned to form a control gate. Passivation and metallization complete the fabrication of the memory cell with improved coupling ratio.

BRIEF DESCRIPTION OF THE DRAWINGS

In the accompanying drawings forming a material part of this description, there is shown.

DESCRIPTION OF THE PREFERRED EMBODIMENTS

Figure 1:
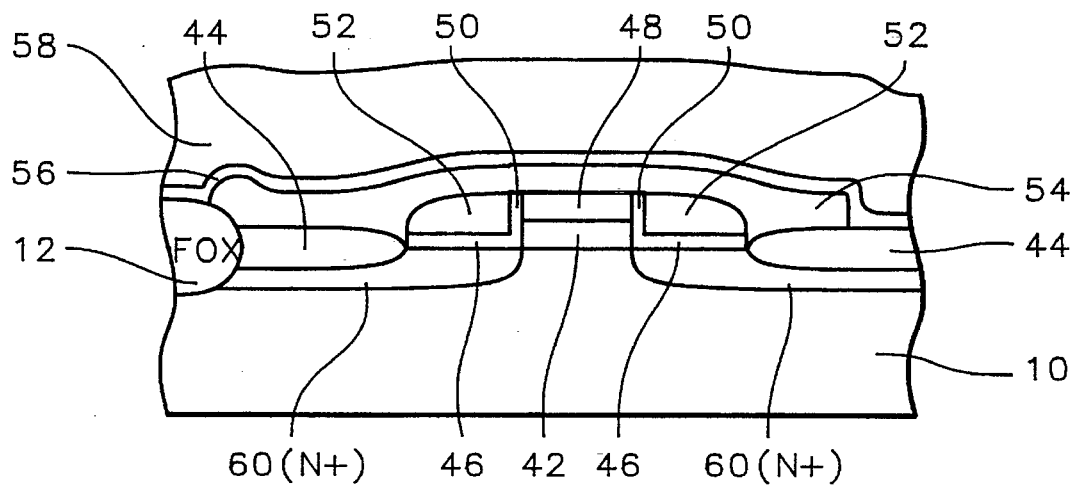
FIG. 1 schematically illustrates in cross-sectional representation a memory cell of the prior art.
Figure 2:
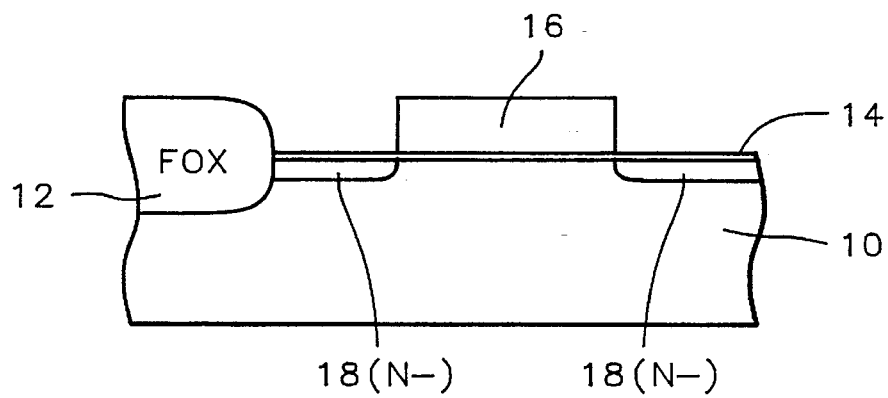
FIGS. 2 through 5 schematically illustrate in cross-sectional representation one preferred embodiment of the present invention.

Referring to FIGS. 2 through 5, the first preferred embodiment of the present invention will be described. Referring now more particularly to FIG. 2, the process of the present invention will be described. A portion of a partially completed memory cell is illustrated in FIG. 2 consisting of a semiconductor substrate 10, preferably composed of monocrystalline silicon. A local oxidation of silicon (LOCOS) process is performed to provide device isolation regions 12. A layer of silicon dioxide 14 is grown over the surfaces of the semiconductor substrate to a thickness of between about 150 to 500 Angstroms. A layer of silicon nitride 16 is deposited over the silicon dioxide layer to a thickness of between about 1000 to 2000 Angstroms and is patterned to cover the major channel region of the planned memory cell.

An optional lightly doped drain ion implantation is made into the substrate not covered by the patterned silicon nitride layer 16 to form lightly doped drain regions 18. This is typically an implantation of phosphorus ions with a dosage of between about 1 E 13 to 5 E 13 atoms/cm2 at a energy of between about 40 to 80 KeV.

Figure 3:
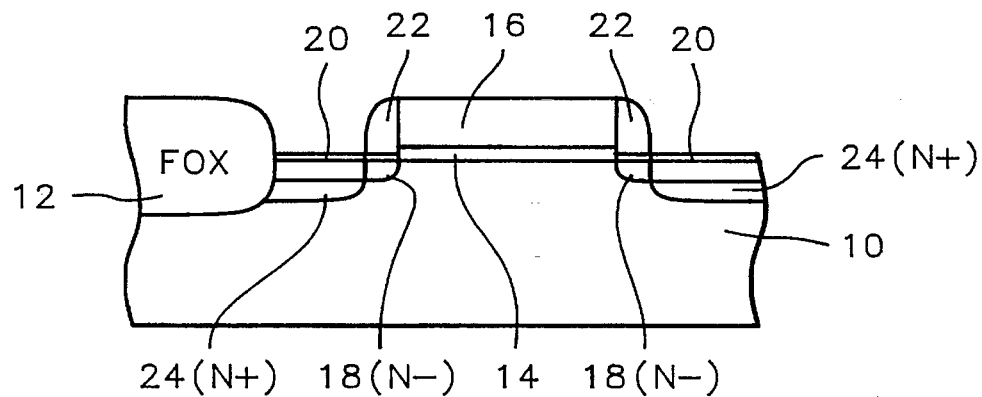

Referring now to FIG. 3, the substrate is dipped into a dilute hydrofluoric acid solution to remove the silicon dioxide layer 14 not covered by the silicon nitride layer 16, exposing portions of the silicon substrate. A thin tunneling oxide 20 is grown on the exposed silicon substrate surfaces to a thickness of between about 70 to 110 Angstroms.

A second layer of silicon nitride is deposited over the surfaces of the substrate and anisotropically etched away leaving silicon nitride spacers 22 on the sidewalls of the patterned silicon nitride layer 16. The spacers are between about 500 to 2000 Angstroms in width. The spacers will protect the underlying thin tunneling oxide 20.

Arsenic ions are implanted into the substrate using the silicon nitride layer 16 and the silicon nitride spacers 22 as a mask to form N+ implanted regions 24 which will act as source and drain regions. The ions are implanted with a dosage of between about 3 E 15 to 8 E 15 atoms/cm2 at a energy of between about 60 to 100 KeV.

Figure 4:
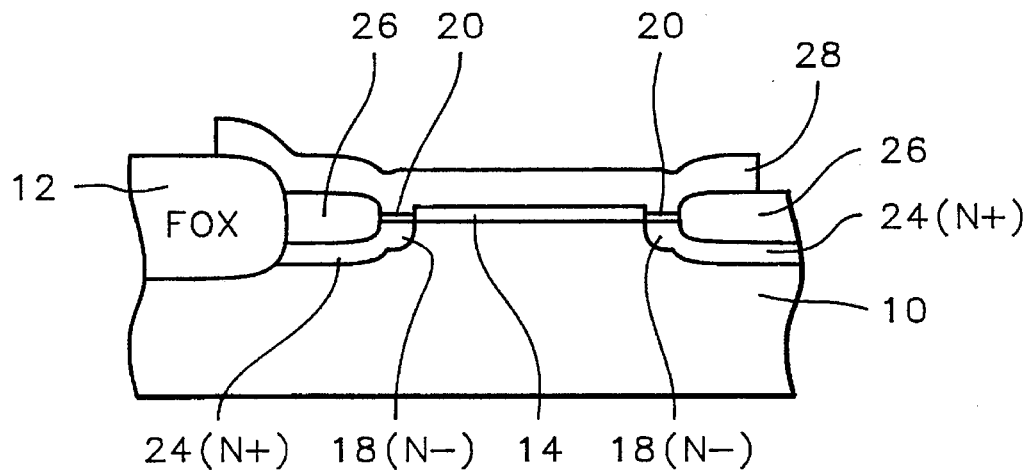

Referring now to FIG. 4, the N+ implanted regions are oxidized to form silicon dioxide regions 26 with a thickness of between about 500 to 1500 Angstroms. The thin tunnel oxide 20 underlying the silicon nitride spacers 22 remains while all other tunneling oxide is incorporated into the silicon dioxide regions 26. The small controllable areas of tunnel oxide 20 provide the improved coupling ratio and the improved short channel effect of the memory cell.

The silicon nitride layer 16 and spacers 22 are removed, typically by a dilute hydrofluoric acid dip followed by a hot phosphoric acid strip. A layer of polysilicon 28 is deposited over the surface of the substrate to a thickness of between about 1000 to 3000 Angstroms, doped, and etched to form the floating gate 28.

Figure 5:
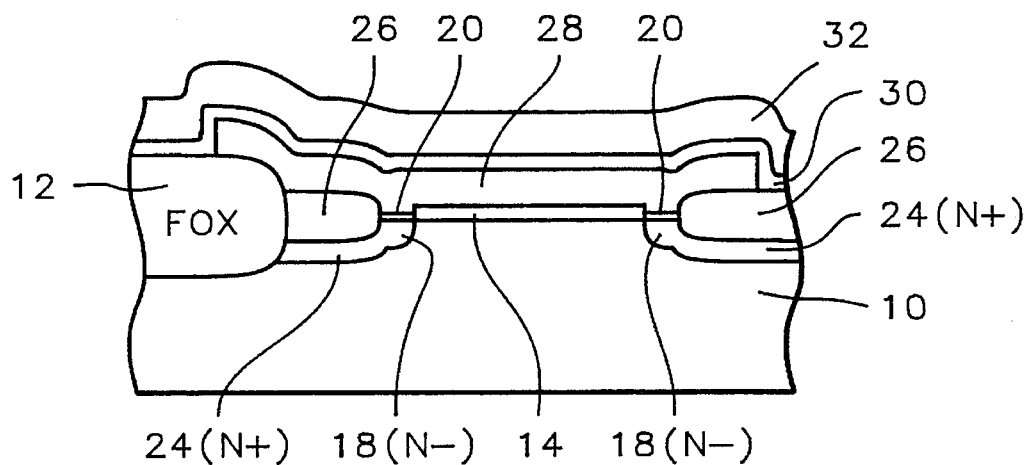

Referring now to FIG. 5, an interpoly dielectric 30, such as ONO (silicon oxide-silicon nitride-silicon oxide) is deposited over the polysilicon layer 28. A second polysilicon layer 32 is deposited over the dielectric 30 to a thickness of between about 2000 to 5000 Angstroms and doped. The second polysilicon layer is etched to form the control gate 32 of the memory cell. This second polysilicon layer 32 could alternatively be a polycide layer, such as tungsten silicide, molybdenum silicide, tantalum silicide, or titanium silicide.

Figure 6:
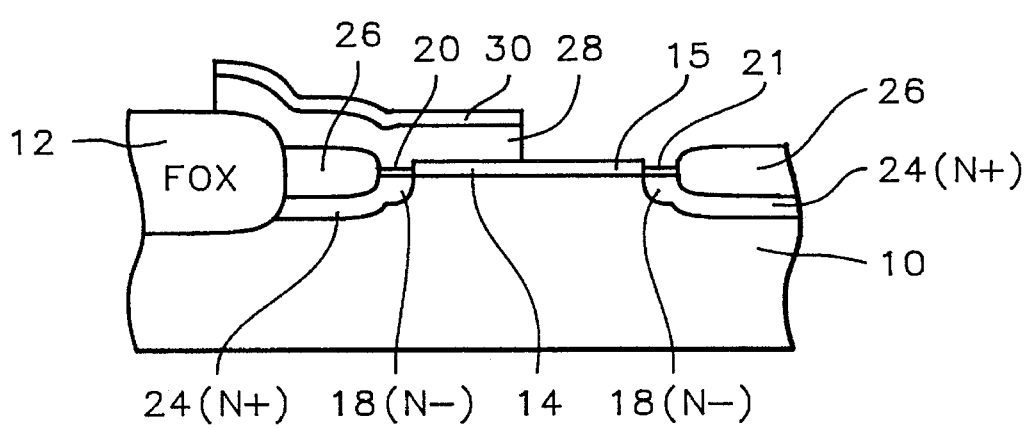
FIGS. 6 and 7 schematically illustrate in cross-sectional representation a second preferred embodiment of the present invention.
Figure 7:
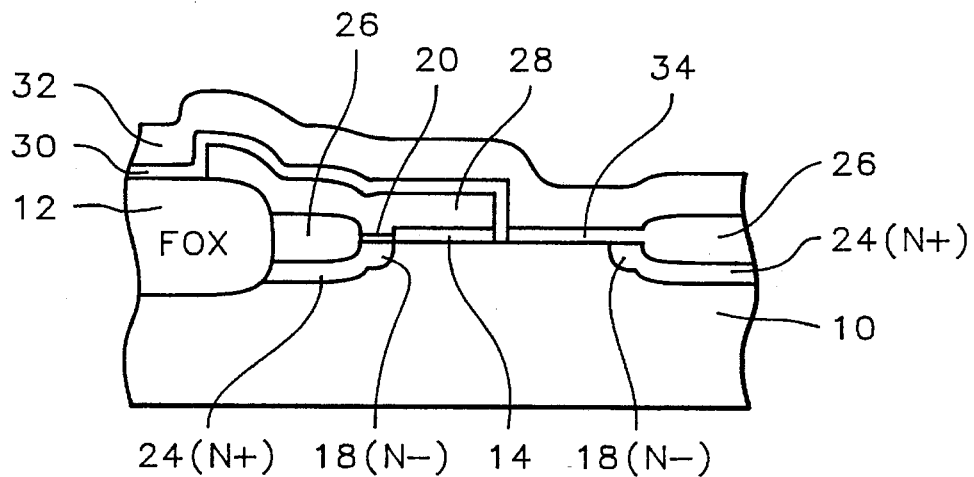

FIGS. 6 and 7 illustrate a second preferred embodiment of the present invention. The process proceeds as for the first embodiment through the steps illustrated in FIG. 3 and through the removal of the silicon nitride layer and spacers. In this embodiment, the first polysilicon layer 28 is deposited over the surface of the substrate and doped, as above. However, the interpoly dielectric layer 30 is deposited before the polysilicon layer is etched. The polysilicon layer 28 and the interpoly dielectric layer 30 are etched to form the floating gate. In this embodiment, the floating gate only partially overlaps the channel area, as shown in FIG. 6. The portion of the silicon dioxide layer 14 labeled 15 is not covered by the floating gate. The tunneling oxide 21 also is left uncovered.

Referring now to FIG. 7, the exposed silicon dioxide 15 and tunneling oxide 21 are removed by dipping the substrate into dilute hydrofluoric acid, thereby exposing the underlying silicon substrate. The exposed silicon is oxidized to form silicon dioxide region 34. The second polysilicon or polycide layer 32 is deposited to a thickness of between about 2000 to 5000 Angstroms, doped, and patterned to form the control gate of the memory cell.

Figure 8:
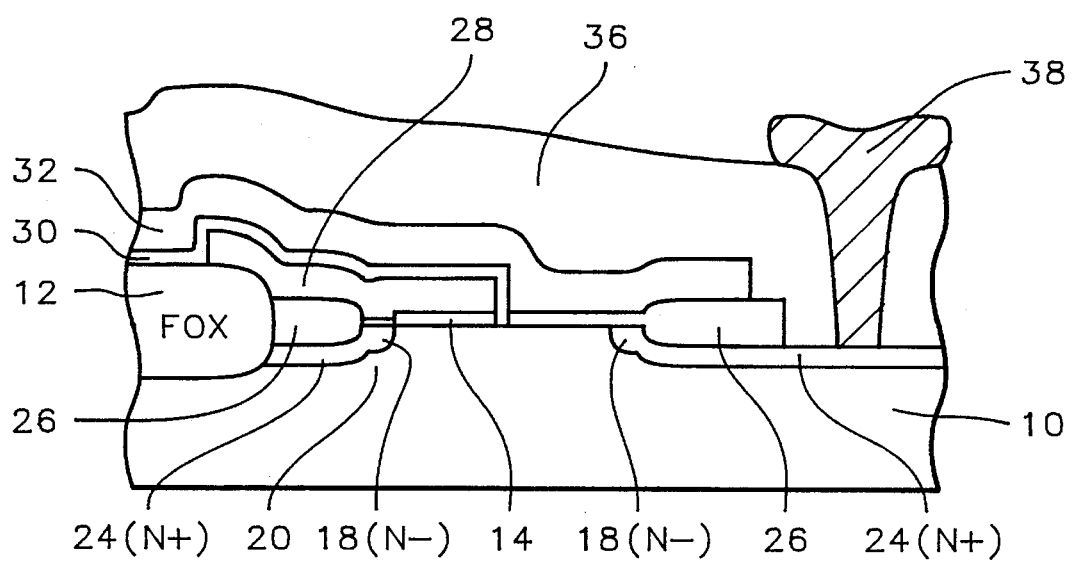
FIG. 8 schematically illustrates in cross-sectional representation a completed memory cell of the present invention.

Back-end processing continues as is conventional in the art for both the first and second preferred embodiments. As illustrated in FIG. 8 for the second embodiment, a dielectric layer 36 such as borophosphosilicate glass (BPSG), is deposited over the surface of the substrate. Contact openings are etched through the dielectric layer to expose the drain regions 24 where contact is desired. Metal layer 38, typically aluminum, is deposited and patterned to complete the contacts.

The advantages of the present invention are a less complex process than the prior art with only one sidewall spacer etchback and two polysilicon layers rather than four, resulting in a smaller step height.

While the invention has been particularly shown and described with reference to the preferred embodiments thereof, it will be understood by those skilled in the art that various changes in form and details may be made without departing from the spirit and scope of the invention.

What is claimed is:

1. A non-volatile memory, comprising:

first and second source/drain regions formed in a semiconductor substrate, each of the source/drain regions having a first part having a first doping level and a second part having a second, lower doping level;

a relatively thick silicon dioxide region formed on at least part of the first source/drain region so that the second part of the first source/drain extends laterally along a surface of the semiconductor substrate beyond the relatively thick silicon dioxide region;

a relatively thin tunnel oxide region disposed between the relatively thick silicon dioxide region and a gate oxide of intermediate thickness to the thin tunnel oxide region and the relatively thick silicon dioxide region, wherein an edge of the second part of the first source/drain region at the surface of the semiconductor substrate is self-aligned with the relatively thin tunnel oxide region;

a polysilicon floating gate formed in contact with the gate oxide, the relatively thin tunnel oxide region and the relatively thick silicon dioxide region;

an interpoly dielectric layer overlying the polysilicon floating gate; and a control gate overlying the interpoly dielectric layer.

2. A non-volatile memory, comprising:

first and second source/drain regions formed in a semiconductor substrate;

a relatively thick silicon dioxide region formed on at least part of the first source/drain region;

a relatively thin tunnel oxide region disposed between the relatively thick silicon dioxide region and a gate oxide of intermediate thickness to the thin tunnel oxide region and the relatively thick silicon dioxide region, wherein an edge of the first source/drain region at a surface of the semiconductor substrate is self aligned with the relatively thin tunnel oxide region;

a polysilicon floating gate formed in contact with the gate oxide, the relatively thin tunnel oxide region and the relatively thick silicon dioxide region, the polysilicon gate extending partially between the first source/drain region and the second source drain region;

an interpoly dielectric layer overlying the polysilicon floating gate; and a control gate overlying the interpoly dielectric layer and extending along the gate oxide above the substrate between the first source/drain region and the second source drain region.

3. A non-volatile memory comprising:

a polysilicon floating gate over the surface of a semiconductor substrate;

first; and second source/drain regions formed in the semiconductor substrate;

relatively thin tunnel oxide regions surrounded by relatively thick silicon dioxide regions underlying the polysilicon floating gate, wherein at least one of the relatively thick silicon dioxide regions lies on at least part of the first source/drain region and wherein an edge of the first source/drain region at a surface of the semiconductor substrate is self-aligned with one of the relatively thin tunnel oxide regions;

a gate oxide of intermediate and uniform thickness extending between the relatively thin tunnel oxide regions, the thickness of the gate oxide being intermediate to the thin tunnel oxide regions and the relatively thicker silicon dioxide regions, wherein the polysilicon floating gate extends incontact with at least one thin tunnel oxide region and a length of the gate oxide adjacent the at least one thin tunnel oxide region;

an interpoly dielectric layer overlying the polysilicon floating gate; and a control gate overlying the interpoly dielectric layer.

4. The memory of claim 3 wherein the tunnel oxide has a thickness of between about 70 to 110 Angstroms.

5. The memory of claim 3 wherein the silicon dioxide regions are between about 500 to 1500 Angstroms in thickness.

6. The memory of claim 3 wherein the interpoly dielectric layer is composed of ONO (silicon oxide-silicon nitride-silicon oxide).

7. The memory of claim 3 wherein the control gate comprises polysilicon.

8. The memory of claim 3 wherein the control gate comprises polycide.

* * * * *